US008319319B2

(12) United States Patent
Jang

(10) Patent No.: US 8,319,319 B2
(45) Date of Patent: Nov. 27, 2012

(54) SEMICONDUCTOR PACKAGE AND MOUNTING METHOD THEREOF

(75) Inventor: Young-Cheol Jang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 60 days.

(21) Appl. No.: 12/235,739

(22) Filed: Sep. 23, 2008

(65) Prior Publication Data

US 2009/0121362 A1    May 14, 2009

(30) Foreign Application Priority Data

Nov. 12, 2007    (KR) .................. 10-2007-0114898

(51) Int. Cl.
*H01L 23/495* (2006.01)

(52) U.S. Cl. .. 257/676; 257/690; 257/782; 257/E23.061

(58) Field of Classification Search ................... 257/782
See application file for complete search history.

(56) References Cited

U.S. PATENT DOCUMENTS

| | | | |
|---|---|---|---|
| 5,069,626 A | | 12/1991 | Patterson et al. |
| 6,037,657 A | * | 3/2000 | Tsurumi et al. ............. 257/704 |
| 6,365,976 B1 | * | 4/2002 | Carter et al. ................. 257/779 |
| 6,365,980 B1 | * | 4/2002 | Carter et al. ................. 257/787 |
| 6,400,021 B1 | | 6/2002 | Cho |
| 2002/0168796 A1 | * | 11/2002 | Shimanuki et al. .......... 438/106 |
| 2003/0006055 A1 | | 1/2003 | Chien-Hung et al. |
| 2006/0286716 A1 | * | 12/2006 | Takayama .................... 438/108 |
| 2007/0273017 A1 | * | 11/2007 | Maloney et al. ............. 257/690 |

FOREIGN PATENT DOCUMENTS

| | | |
|---|---|---|
| JP | 02-017854 U | 2/1990 |
| JP | 02-197139 | 8/1990 |
| JP | 05-102381 | 4/1993 |
| JP | 05-077947 U | 10/1993 |
| JP | 11-145599 | 5/1999 |
| JP | 2000-294719 | 10/2000 |
| JP | 2003-188335 | 7/2003 |
| JP | 2004-039882 | 2/2004 |
| JP | 2005-191574 | 7/2005 |
| JP | 2006-019767 | 1/2006 |
| JP | 2006-100753 | 4/2006 |

(Continued)

OTHER PUBLICATIONS

Office Action issued by Korean Intellectual Property Office in Korean Patent Application No. 10-2007-0114898 on May 7, 2009.

(Continued)

*Primary Examiner* — Ha Tran T Nguyen
*Assistant Examiner* — Raj R Gupta
(74) *Attorney, Agent, or Firm* — Christie, Parker & Hale, LLP

(57) ABSTRACT

A semiconductor package and mounting method of improving reliability by strengthening adhesive strength of both a printed circuit board and a surface mounting package, includes a chip pad on which a semiconductor device is disposed, and lead terminals, wherein at least one of the chip pad and the lead terminals have a plurality of grooves. Accordingly, in comparison with a typical package, since a plurality of grooves are formed on both a chip pad and lead terminals of a package adhering to a printed circuit, an adhesive area of both the package and the cream solder is widened so that the shearing strength may be improved and greater solder joint reliability can be acquired.

13 Claims, 7 Drawing Sheets

FOREIGN PATENT DOCUMENTS

| | | |
|---|---|---|
| JP | 2006-237653 | 9/2006 |
| JP | 2006-253357 | 9/2006 |
| JP | 2006-319030 | 11/2006 |
| KR | 10-1998-048268 | 9/1998 |
| KR | 2002-86219 | 11/2002 |
| WO | WO 9704481 A1 * | 2/1997 |

OTHER PUBLICATIONS

Korean Office Action issued on Nov. 27, 2009 in corresponding Korean Patent Application No. 10-2007-0114898.
Chinese Office Action issued on Nov. 27, 2009 in corresponding Chinese Patent Application No. 200810174033.2.
Japanese Office action dated Nov. 24, 2010, for corresponding Japanese Patent application 2008-048152.
Patent Abstracts of Japan and English machine translation of Japanese Publication 2006-253357 listed above, 19 pages.
Japanese Office action dated Dec. 20, 2011, for corresponding Japanese Patent application 2008-048152, 3 pages.
Patent Abstracts of Japan, and English machine translation of Japanese Publication 05-102381, listed above, 12 pages.
Patent Abstracts of Japan, and English machine translation of Japanese Publication 11-145599, listed above, 10 pages.
Patent Abstracts of Japan, and English machine translation of Japanese Publication 2000-294719, listed above, 24 pages.

* cited by examiner

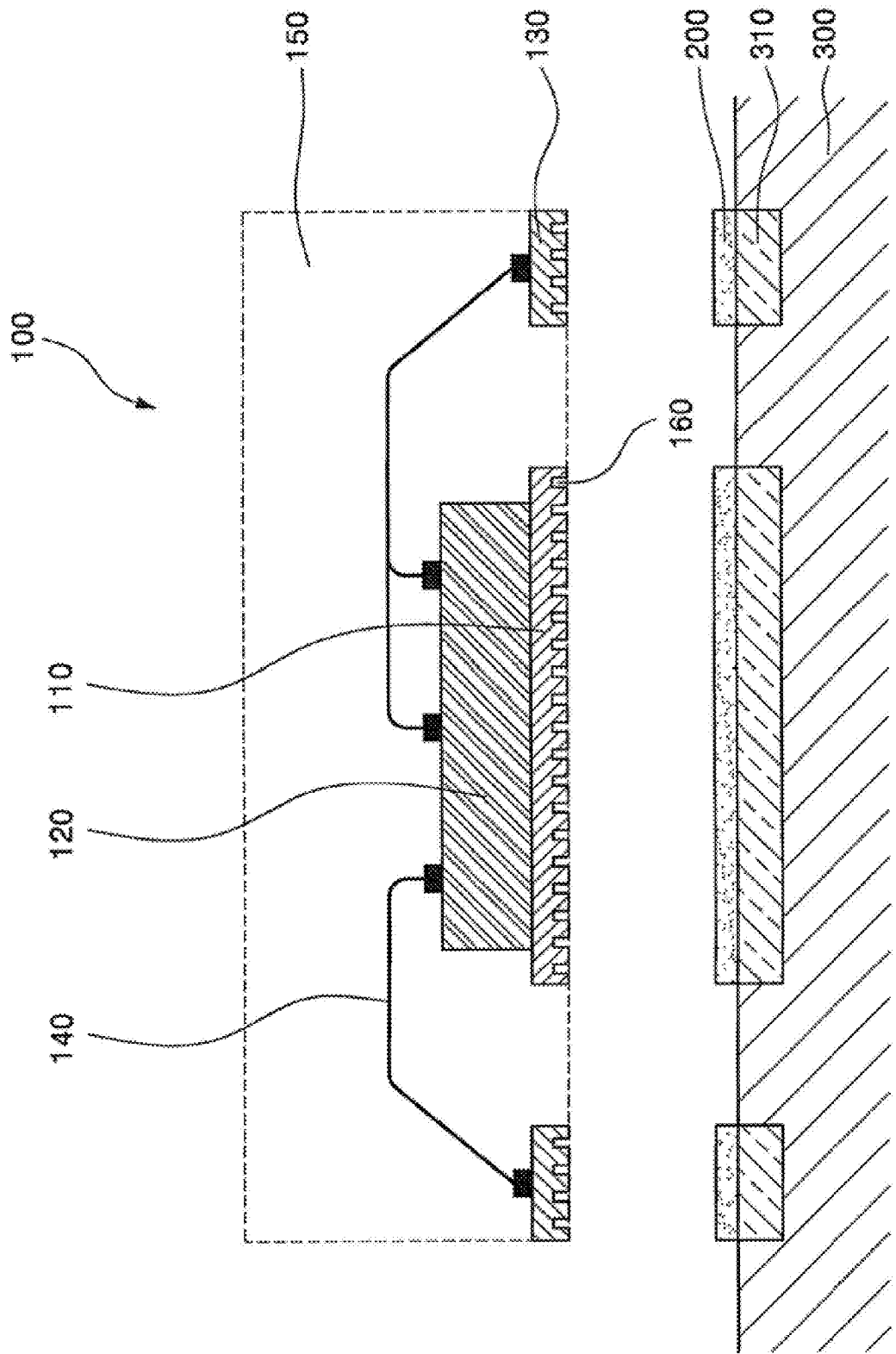

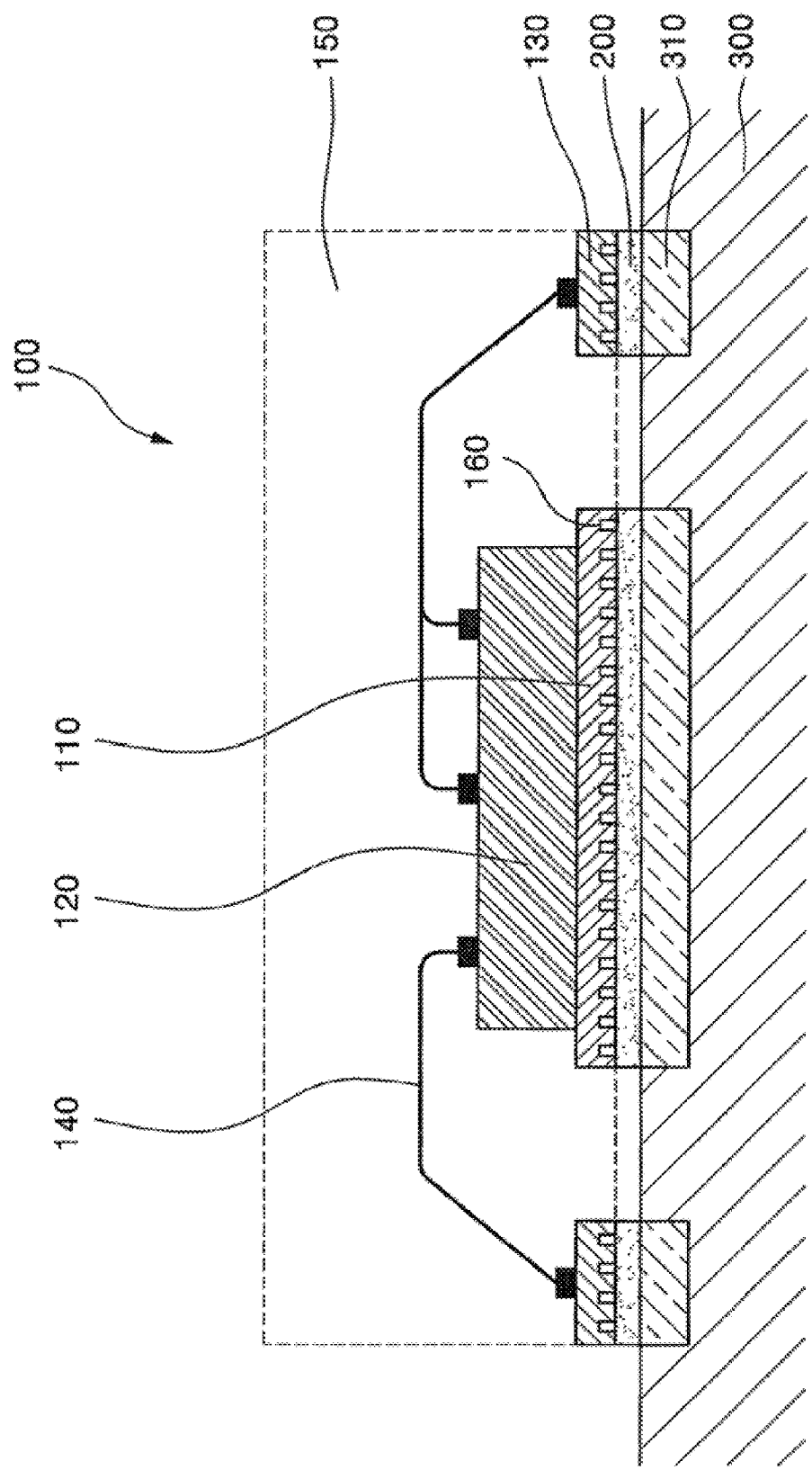

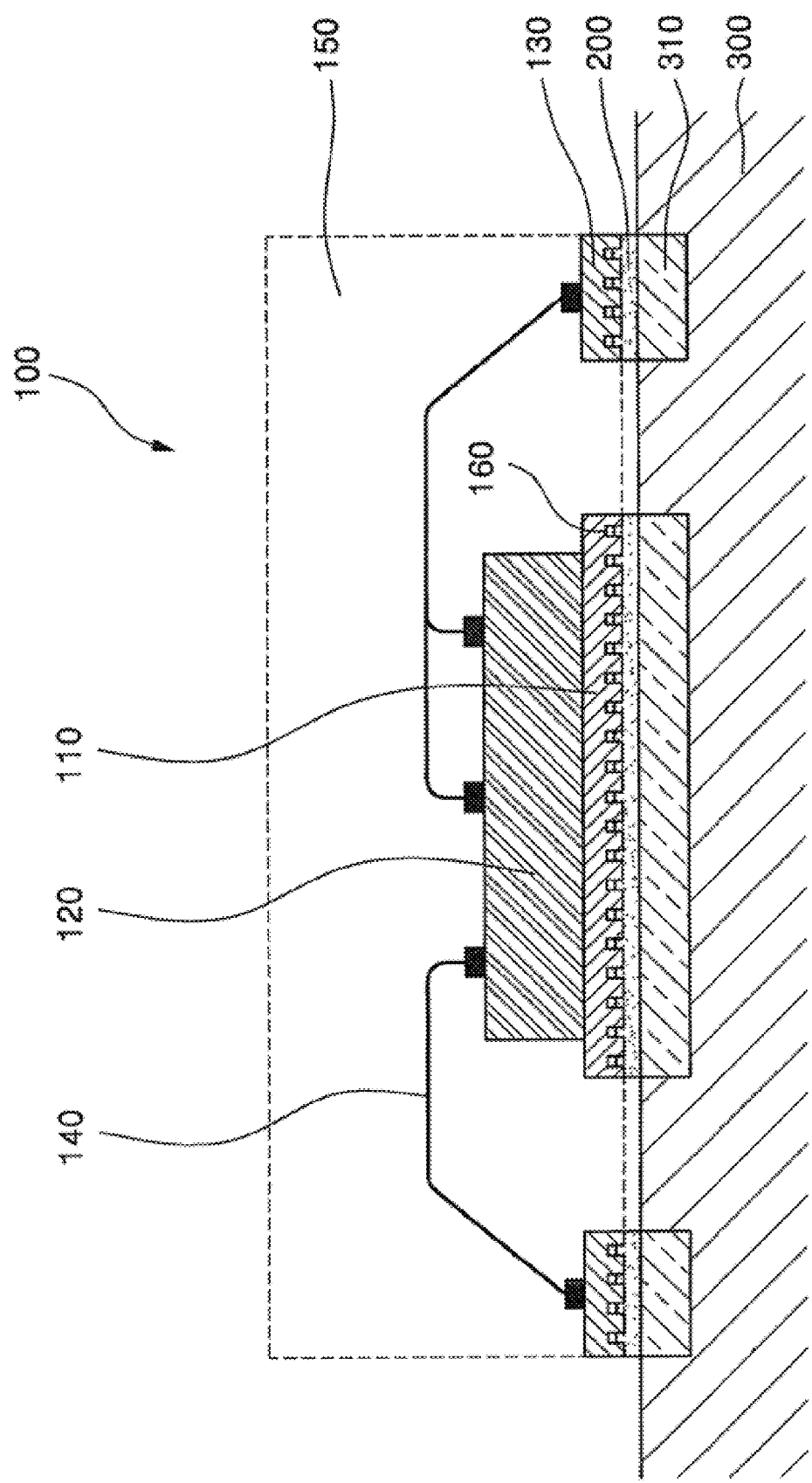

SEMICONDUCTOR PACKAGE AND MOUNTING METHOD THEREOF

CROSS-REFERENCE TO RELATED APPLICATION

This application claims the benefit of Korean Application No. 2007-114898, filed Nov. 12, 2007 in the Korean Intellectual Property Office, the disclosure of which is incorporated herein by reference.

BACKGROUND OF THE INVENTION

1. Field of the Invention

Aspects of the present invention relate to a semiconductor package and mounting method of improving reliability by strengthening adhesion strength between a printed circuit board and a surface mounting package.

2. Description of the Related Art

Commonly used surface mounting packages include a small outline J-lead (SOJ) type surface mounting package, and a special usage Zigzag Inline Package (ZIP) surface mounting package. Further, there is a Thin Small Outline Package (TSOP) type of surface mounting package that is suitable for a standardized memory card.

A typical surface mounting package is formed with gold-plated nickel, and configured with a chip pad on which a semiconductor device will be adhered, and lead terminals for electrically connecting the package to an external device. Since the semiconductor device and the lead terminals include either an adhesive tape or an adhesive agent, they are electrically connected with wires. Further, the package is completed by forming an enveloping unit that is molded with epoxy molding compound (EMC) in order to protect the semiconductor device from any damage due to external thermal effects and external mechanical or chemical impacts.

In order to mount a typical Bottom Leaded Plastic Package (BLP) on a Printed Circuit Board (PCB), cream solder is coated on the PCB to contact a chip pad and terminals of the BLP, and heat is applied to the PCB and the BLP disposed thereon. Thereby, the cream solder is melted and hardened, so the package is finally mounted on the PCB.

SUMMARY OF THE INVENTION

According to aspects of the present invention, a semiconductor package has a chip pad on which a semiconductor device is disposed, and has lead terminals, wherein at least one of the chip pad and the lead terminals comprise a plurality of grooves.

According to an aspect of the present invention, the semiconductor device may be connected to the lead terminals by wiring. According to an aspect of the present invention, the chip pad may be made of nickel coated with gold. According to an aspect of the present invention, the grooves may extend in one direction.

According to an aspect of the present invention, the grooves may have a mesh shape. According to an aspect of the present invention, the grooves have a matrix shape. According to an aspect of the present invention, the grooves are formed when the chip pad and the lead terminals are formed, or after the semiconductor package is completed.

According to another aspect of the present invention, a method includes; providing a printed circuit board having terminals; coating cream solder on the terminals of the printed circuit board; disposing a semiconductor package having a chip pad and lead terminals on the printed circuit board, the chip pad and the lead terminals having a plurality of grooves; forcing the cream solder into the plurality of grooves by pressing together the semiconductor package and the printed circuit board; and adhering the semiconductor package onto the printed circuit board by hardening the cream solder.

According to another aspect of the present invention, a semiconductor package includes: a semiconductor device, a chip pad on which the semiconductor device is disposed; lead terminals electrically connected to the semiconductor device by respective wires; and an enveloping unit that is molded to envelop the semiconductor device, the chip pad, and the lead terminals, except for a surface of each of the chip pad and the lead terminals that are externally exposed, wherein the chip pad and the lead terminals comprise a plurality of grooves that are formed over the exposed surfaces of the chip pad and the lead terminals.

According to another aspect of the present invention, a mounting method of a semiconductor package includes: providing a printed circuit board having terminals; coating cream solder on the terminals of the printed circuit board; disposing a semiconductor package on the printed circuit board, the semiconductor package includes: a semiconductor device, a chip pad on which the semiconductor device is disposed, lead terminals electrically connected to the semiconductor device by respective wires, and an enveloping unit that is molded to envelop the semiconductor device, the chip pad, and the lead terminals, except for a surface of each of the chip pad and the lead terminals that are externally exposed, wherein the chip pad and the lead terminals comprise a plurality of grooves that are formed over the exposed surfaces of the chip pad and the lead terminals, and the chip pad and the lead terminals are aligned to the terminals of the printed circuit board; forcing the cream solder into the plurality of grooves by pressing together the semiconductor package and the printed circuit board; and adhering the semiconductor package onto the printed circuit board by hardening the cream solder.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIGS. 2A through 2D are drawings illustrating a mounting method of a semiconductor package according to an aspect of the present invention.

DETAILED DESCRIPTION OF THE EMBODIMENTS

Figure 1A:
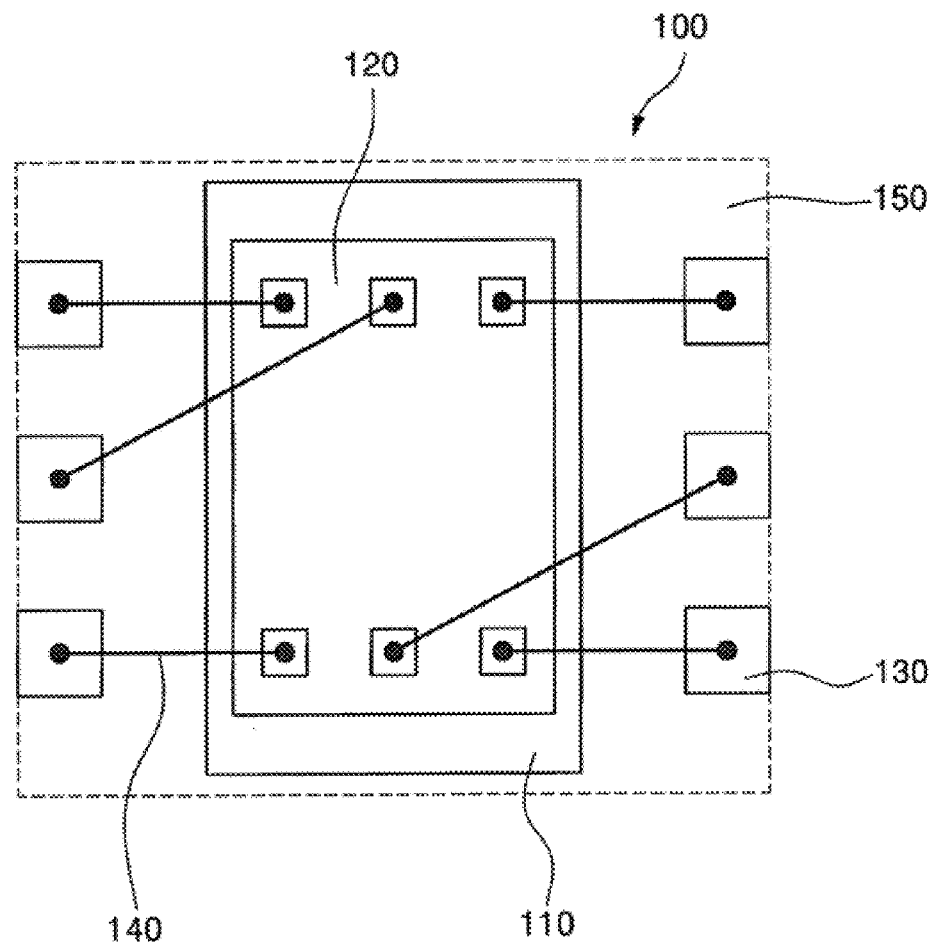
FIG. 1A is a plan view illustrating a structure of a semiconductor package according to an aspect of the present invention.
Figure 1B:
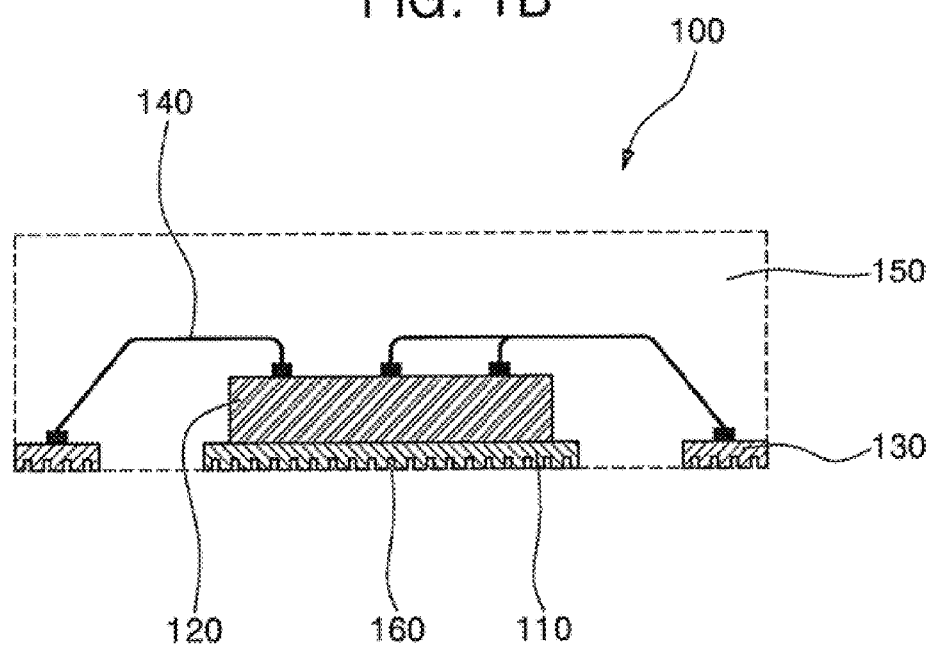
FIG. 1B is a side elevational view of the semiconductor package of FIG. 1A.

Reference will now be made in detail to aspects of the present invention, examples of which are illustrated in the accompanying drawings, wherein like reference numerals refer to the like elements throughout. The aspects are described below in order to explain the present invention by referring to the figures. FIG. 1A is a plan view illustrating a structure of a semiconductor package according to an aspect of the present invention, and FIG. 1B is a side elevational view of the semiconductor package of FIG. 1A. Referring to FIGS. 1A and 1B, a package 100 may comprise a chip pad 110 on which a semiconductor device 120 is disposed, a plurality of lead terminals 130 to externally connect the semiconductor device 120, and wires 140 to electrically connect the semiconductor device 120 to the lead terminals 130.

The semiconductor device 120 and the lead terminals 130 are electrically connected to each other by fixing themselves with either an adhesive tape or an adhesive agent. Further, the package is completed by forming an enveloping unit 150 that is molded with an epoxy molding compound (EMC) in order to protect the semiconductor device 120 from any damage due to thermal effects, or external mechanical or chemical impacts.

As shown in FIG. 1B, the enveloping unit 150 may be formed to entirely envelope the semiconductor device 120, and most of the chip pad 110 on which the semiconductor device 120 is disposed and most of the plurality of lead terminals 130, except for one surface on each of the chip pad 110 and the plurality of lead terminals 130. In aspects of the present invention, the non-enveloped surfaces of the chip pad 110 and the plurality of lead terminals 130 are substantially coplanar, and are externally exposed.

Figure 1C:
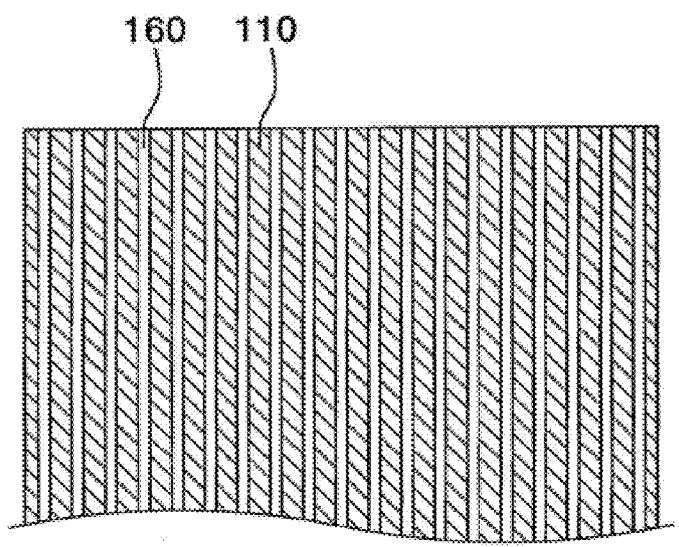
FIGS. 1C through 1E are aspects of the present invention in which grooves are formed in a chip pad and lead terminals of FIG. 1A.
Figure 1D:
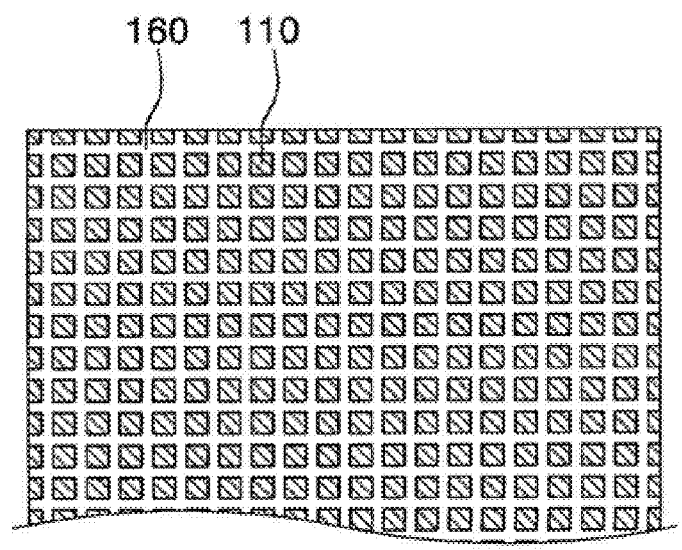
Figure 1E:
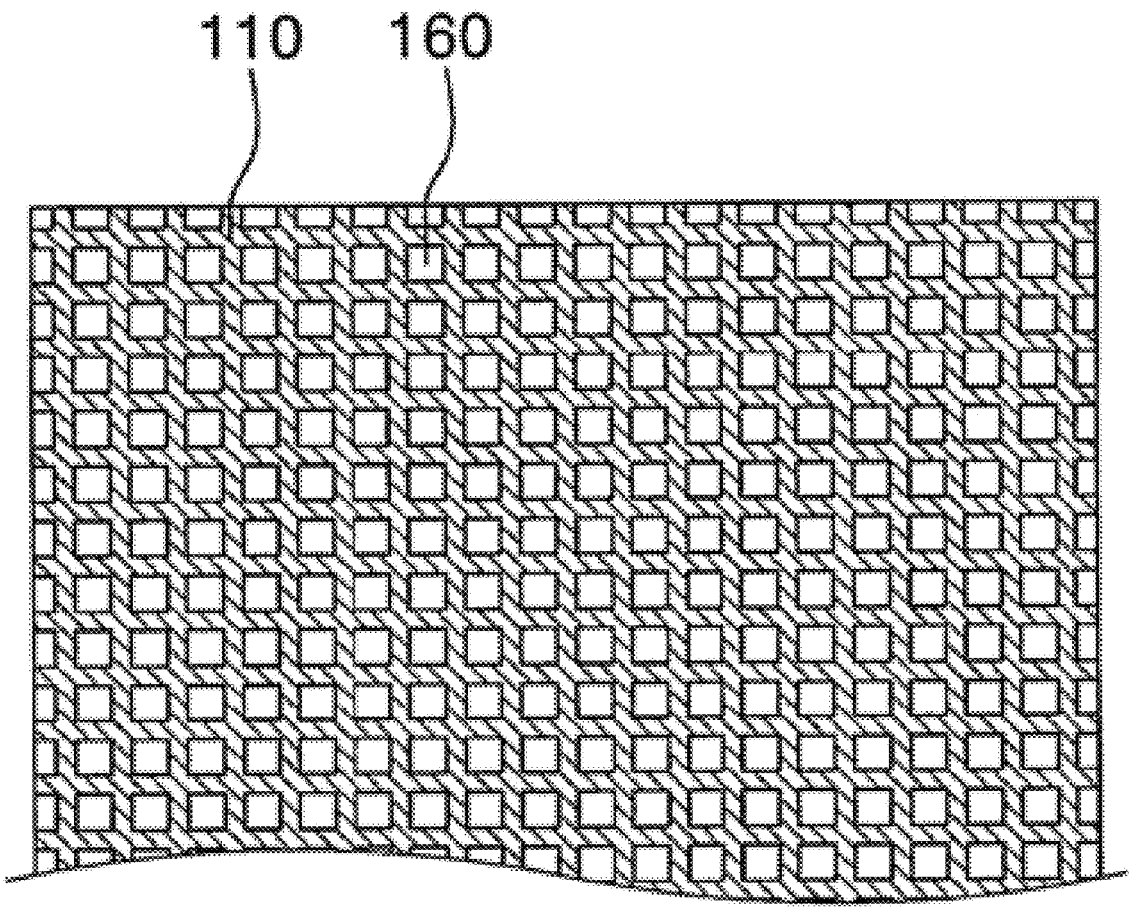

As shown in FIG. 1B, a plurality of grooves 160 may be formed on a surface of both the chip pad 110 on which the semiconductor device is disposed, and the lead terminals 130, respectively, in order to improve shearing strength thereof by acquiring increased adhesive (or surface) areas available for adhesion. The grooves 160, may be extendedly formed in one direction as illustrated in FIG. 1C, in a mesh shape as illustrated in FIG. 1D, or in a matrix shape as illustrated in FIG. 1E. As shown in FIG. 1B, the surfaces on which the plurality of grooves 160 are formed are substantially coplanar. The grooves 160 recede from a plane of an outermost boundary of the enveloping unit 150 from a surface of the chip pad 110 and the lead terminals 130.

Further, in aspects of the present invention, shapes or cross sectional profiles of the grooves 160 may be formed as desired. That is, edges of the grooves 160 may be formed as one of right angles (as shown in FIG. 1B) and curved surfaces. In aspects of the present invention, other shapes of the grooves 160 are also possible, such as triangular or pyramidal shapes.

In aspects of the present invention where the grooves 160 are extendedly formed in one direction as illustrated in FIG. 1C, cross sectional shapes of the grooves 160 may outline a square wave pattern as shown in FIG. 1B, or may outline a triangular wave, a sinusoidal wave, or other wave patterns. In such cases, the periodicity of the grooves 160 may be regular so that intervals between each groove 160 may be equal, though such is not required. Accordingly, the grooves 160 may also be formed at irregular intervals or at any desired intervals.

FIG. 1D illustrates a mesh shape arrangement of the grooves 160, and FIG. 1E illustrates a matrix shape arrangement of the grooves 160. That is, FIG. 1D illustrates an arrangement of a set of the grooves 160 that extend perpendicularly to another set of the grooves 160, and FIG. 1E illustrates an arrangement of grooves 160 that extend discontinuously. Although square shaped land areas are formed in between the grooves 160 in FIG. 1D, and square shaped indentations are formed by the grooves 160 in FIG. 1E, such is not required, and the shapes of the lands or indentations that may be formed by the grooves 160 may be circular, hexagonal, triangular, or other shapes.

Accordingly, it will be understood by those skilled in the art that a variety of modifications and variations of the grooves 160 may be made to the aspects herein without departing from the spirit and scope of the present invention.

In aspects of the present invention, the grooves 160 may be formed on at least one of the chip pad 110 and the lead terminals 130 (i.e., on the chip pad 110, the lead terminals 130, or both). Also, the grooves 160 may be formed when the chip pad 110 and the lead terminals 130 are formed, or after the package 100 is completed once an epoxy molding compound (EMC) is molded thereon, for example. Thus, it will be understood that, in order to form the grooves 160 more conveniently and easily in the manufacturing process of the package, the timing of forming the grooves can be selected accordingly.

Additionally, in aspects of the present invention, a cream solder is filled up in the grooves 160. Accordingly, areas of adhesion may be widened or increased so that shearing strength of the chip pad 110 and/or the lead terminals 130 relative to a printed circuit board may be improved, and greater solder joint reliability can be acquired therefore.

Figure 2D:
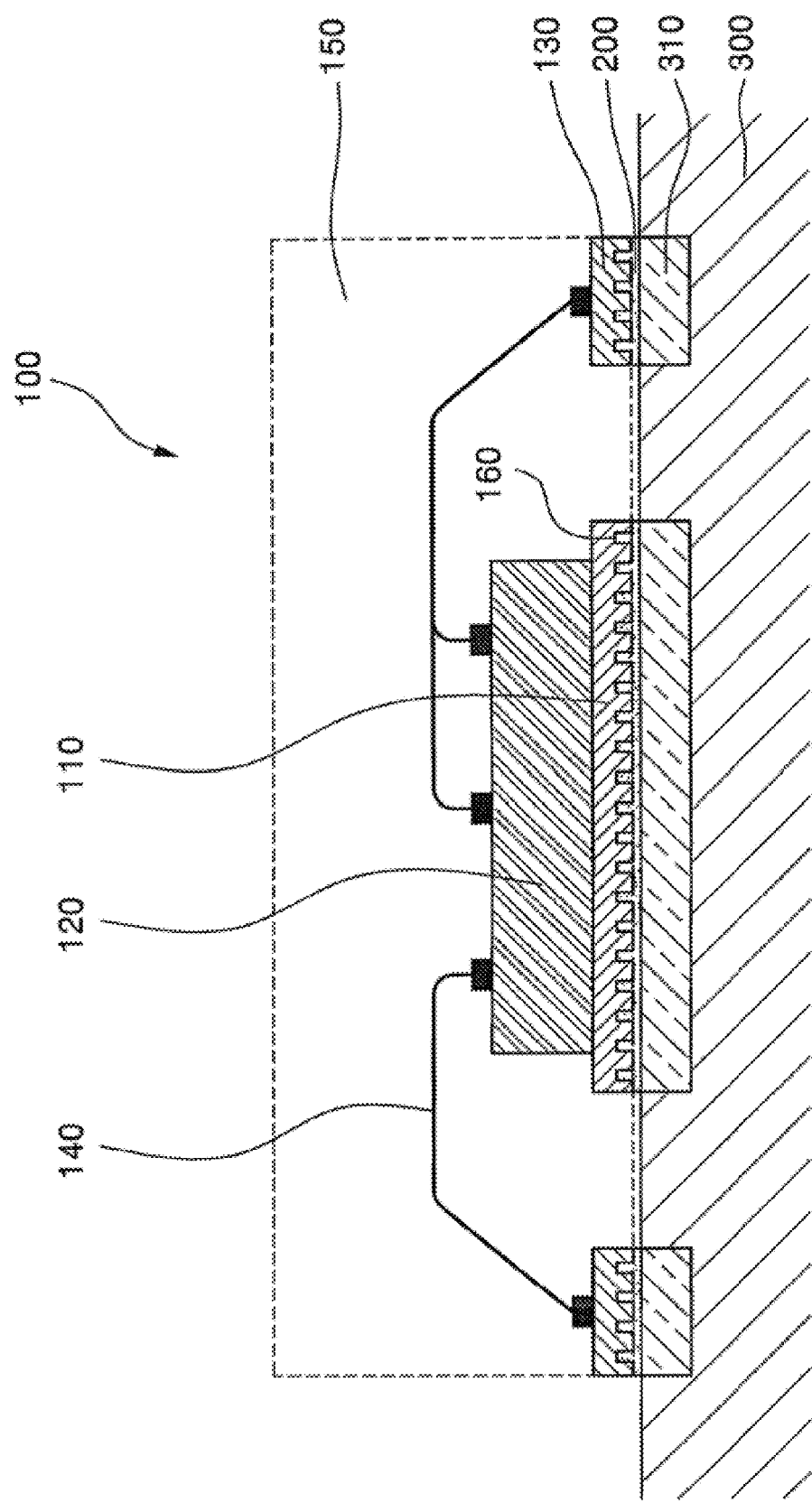

FIGS. 2A through 2D are drawings illustrating a mounting method of a semiconductor package according to aspects of the present invention. FIG. 2A shows cream solder 200 that is coated on PCB terminals 310 formed on the printed circuit board (PCB) 300 before adhering the printed circuit board 300 to the package 100.

As shown in FIG. 2A, for example, the package 100 may comprise the chip pad 110 and the lead terminals 130. The chip pad 110 and the lead terminals 130 may have a plurality of the grooves 160 at surfaces to which the printed circuit board 300 is adhered. For example, the chip pad 110 and the lead terminals 130 are adhered to the printed circuit board 300 by way of the PCB terminals 310.

FIG. 2B shows disposing the package 100 on the printed circuit board 300 in order to adhere the package 100 to the printed circuit board 300. Here, the chip pad 110 and lead terminals 130 may be disposed on the PCB terminals 310 and cream solder 200, respectively, while being closely contacted.

FIG. 2C shows adhering the package 100 to the printed circuit board 300. Here, the cream solder 200 may flow into the grooves 160 formed on the chip pad 110 and the lead terminals 130 of the package 100 by melting the cream solder 200 by use of heat, and pressing the package 100 and the printed circuit board 300 together.

FIG. 2D shows incorporating the package 100 into the printed circuit board 300. Here, some of the melted cream solder 200 may flow into the grooves 160 of both the chip pad 110 and the lead terminals 130, and harden, thereby mounting the package 100 to the printed circuit board 300.

Additionally, filling up or intrusion of the cream solder 200 into the grooves 160 according to aspects of the present invention enable interlocking of the land portions of the chip pad 110 and/or the lead terminals 130 with the cream solder 200 once the cream solder 200 is hardened, to increase shear strength of the package 100 relative to the printed circuit board 300.

Accordingly, in comparison with a typical package, since the cream solder 200 is filled up in the grooves 160, the adhesive areas may be widened or increased so that the shearing strength may be improved and greater solder joint reliability can be acquired.

In various aspects, at least one of refers to alternatives chosen from available elements so as to include one or more of the elements. For example, if the elements available include elements X, Y, and Z, at least one of refers to X, Y, Z, or any combination thereof.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A semiconductor package comprising:
   a chip pad on which a semiconductor device is disposed;
   lead terminals, wherein the chip pad and at least one of the lead terminals comprise a plurality of grooves, each of the grooves being between groove defining walls of a corresponding one of the chip pad and the at least one of the lead terminals; and
   an enveloping unit to cover the chip pad and the lead terminals,
   wherein the grooves are formed such that the grooves recede from a plane of an outermost boundary of the enveloping unit from a surface of the chip pad and the at least one of the lead terminals upon which the grooves are formed, the grooves being formed only partially through the chip pad and the at least one of the lead terminals, toward an opposite surface of the chip pad and the at least one of the lead terminals, and
   wherein areas of the surface of the chip pad and the at least one of the lead terminals between the receded grooves have a rectilinear shape.

2. The semiconductor package of claim 1, wherein the semiconductor device is connected to the lead terminals by wiring.

3. The semiconductor package of claim 1, wherein the chip pad is made of nickel coated with gold.

4. The semiconductor package of claim 1, wherein the grooves are formed extendedly in one direction.

5. The semiconductor package of claim 1, wherein the grooves have a mesh shape.

6. The semiconductor package of claim 1, wherein the grooves have a matrix shape.

7. The semiconductor package of claim 1, wherein the grooves are formed when the chip pad and the lead terminals are formed.

8. The semiconductor package of claim 1, wherein the grooves are formed after the semiconductor package is completed.

9. The semiconductor package of claim 1, wherein the plurality of grooves has hardened cream solder that was forced into the plurality of grooves while melted.

10. A semiconductor package comprising:
    a semiconductor device,
    a chip pad on which the semiconductor device is disposed;
    lead terminals electrically connected to the semiconductor device by respective wires; and
    an enveloping unit that is molded to envelop the semiconductor device, the chip pad, and the lead terminals, except for a surface of each of the chip pad and the lead terminals that are externally exposed,
    wherein the chip pad and each of the lead terminals comprise a plurality of grooves that are formed over the exposed surfaces of the chip pad and the lead terminals, each of the grooves being between groove-defining walls of a corresponding one of the chip pad and the lead terminals,
    wherein the grooves are formed such that the grooves recede from a plane of an outermost boundary of the enveloping unit from a surface of the chip pad and the lead terminals upon which the grooves are formed, the grooves being formed only partially through the chip pad and the lead terminals toward an opposite surface of the chip pad and the lead terminals, and
    wherein areas of the surface of the chip pad and the lead terminals between the receded grooves have a rectilinear shape.

11. The semiconductor package of claim 10, wherein the plurality of grooves has hardened cream solder that was forced into the plurality of grooves while melted.

12. The semiconductor package of claim 10, wherein the exposed surfaces of the chip pad and the lead terminals are coplanar.

13. The semiconductor package of claim 10, further comprising hardened cream solder, wherein the plurality of grooves increase surface areas available for the hardened cream solder to improve shearing strength and solder joint reliability of the semiconductor package.

* * * * *